United States Patent
Yang et al.

(10) Patent No.: US 9,882,074 B2
(45) Date of Patent: Jan. 30, 2018

(54) OPTOELECTRONIC DEVICE

(71) Applicant: Samsung Electronics Co., Ltd., Suwon-si, Gyeonggi-do (KR)

(72) Inventors: Jaehyun Yang, Suwon-si (KR); Hyena Kwak, Suwon-si (KR); Hyoungsub Kim, Seoul (KR); Hoojeong Lee, Suwon-si (KR); Seongjun Park, Seoul (KR); Seongjun Jeong, Hwaseong-si (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 0 days.

(21) Appl. No.: 14/940,696

(22) Filed: Nov. 13, 2015

(65) Prior Publication Data
US 2016/0372615 A1    Dec. 22, 2016

(30) Foreign Application Priority Data
Jun. 17, 2015 (KR) .................. 10-2015-0086179

(51) Int. Cl.
*H01L 31/0336* (2006.01)
*H01L 31/112* (2006.01)
*H01L 31/032* (2006.01)

(52) U.S. Cl.
CPC ........ *H01L 31/0336* (2013.01); *H01L 31/032* (2013.01); *H01L 31/1129* (2013.01)

(58) Field of Classification Search
None
See application file for complete search history.

(56) References Cited

U.S. PATENT DOCUMENTS

| | | | |
|---|---|---|---|
| 2009/0206237 A1* | 8/2009 | Shannon | H01L 29/41733 250/214 AL |
| 2011/0036971 A1* | 2/2011 | Ho | H01L 51/424 250/214.1 |
| 2011/0278541 A1* | 11/2011 | Huang | H01L 31/02327 257/21 |
| 2012/0018719 A1* | 1/2012 | Zan | H01L 31/1013 257/43 |
| 2012/0261656 A1 | 10/2012 | Shu et al. | |
| 2015/0255661 A1* | 9/2015 | Liang | H01L 31/18 438/95 |
| 2016/0167136 A1* | 6/2016 | Kotov | B22F 9/24 420/507 |

FOREIGN PATENT DOCUMENTS

WO    WO-2014100723 A1    6/2014

OTHER PUBLICATIONS

Xudong Wang et al. "Ultrasensitive and broadband MoS2 photodetector driven by ferroelectrics". Advanced Materials. Sep. 16, 2015.pp. 1-35.

(Continued)

*Primary Examiner* — Khaja Ahmad
(74) *Attorney, Agent, or Firm* — Harness, Dickey & Pierce, P.L.C.

(57) ABSTRACT

An optoelectronic device is disclosed. The disclosed optoelectronic device includes an oxide semiconductor layer and a semiconducting two-dimensional (2D) material layer forming a stack structure with the oxide semiconductor layer.

20 Claims, 9 Drawing Sheets

(56) References Cited

OTHER PUBLICATIONS

Jaehyun Yang et al. "Large-Area Applicable MoS2—InGaZnO Heterojunction Phototransistor with Broad Spectral Responsivity". Jun. 2, 2015.
Zingway Pei. "High-Responsivity and High-Sensitivity Graphene Dots/a-IGZO Thin-Film Phototransistor". IEEE Electron Device Letters, vol. 36, No. 1. Jan. 2015. pp. 44-46.
F.H.L. Koppens et al. "Photodetectors based on graphene, other two-dimensional materials and hybrid systems". Nature Nanotechnology, vol. 9. Macmillan Publishers Limited. Oct. 2014. pp. 780-793.
Nomura, Kenji, et al., "Room-temperature fabrication of transparent flexible thin-film transistors using amorphous oxide semiconductors," Nature Publishing Group, vol. 432, 25 Nov. 2004, pp. 488-492.
Lee, Je-hun, et al., "42.2: World's Largest (15-inch) XGA AMLCD Panel Using IGZO Oxide TFT," SID 08 Digest, 2008, pp. 625-628.
Jeon, Sanghun, et al., "Gated three-terminal device architecture to eliminate persistent photoconductivity in oxide semiconductor photosensor arrays," Nature Materials, vol. 11, Apr. 2012, pp. 301-306.
Chang, T.H., et al., "High responsivity of amorphous indium gallium zinc oxide phototransistor with $Ta_2O_5$ gate dielectric," Applied Physics Letters, vol. 101, 2012, pp. 261112-1-261112-4.
Chang, T.H., et al., "Amorphous InGaZnO ultraviolet phototransistors with double-stack $Ga_2O_3/SiO_2$ dielectric," Applied Physics Letters, vol. 102, 2013, pp. 221104-1-221104-4.
Tai, Ya-Hsiang, et al., "Active matrix touch sensor detecting time-constant change implemented by dual-gate IGZO TFTs," Solid-State Electronics, vol. 72, 2012, pp. 67-72.
Zan, Hsiao-Wen, et al., "Amorphous indium-gallium-zinc-oxide visible-light phototransistor with a polymeric light absorption layer," Applied Physics Letters, vol. 97, 2010, pp. 203506-1-203506-4.
Li, Jun, et al., "Enhanced photosensitivity of InGaZnO-TFT with a CuPc light absorption layer," Superlattices and Microstructures, vol. 51, 2012, pp. 538-543.
Chen, Tian-An, et al., "Regiocontrolled Synthesis of Poly(3-alkylthiophenes) Mediated by Rieke Zinc: Their Characterization and Solid-State Properties," American Chemical Society, vol. 117, 1995, pp. 233-244.
Lin, Chi-Feng, et al., "High Photoelectric Conversion Efficiency of Metal Phthalocyanine/Fullerene Heterojunction Photovoltaic Device," International Journal of Molecular Sciences, vol. 12, 2011, pp. 476-505.
Wang, Qing Hua, et al. "Electronics and optoelectronics of two-dimensional transition metal dichalcogenides," Nature Nanotechnology, vol. 7, Nov. 2012, pp. 699-712.
Choi, Woong, et al., "High-Detectivity Multilayer $MoS_2$ Phototransistors with Spectral Response from Ultraviolet to Infrared," Advanced Materials, vol. 24, 2012, pp. 5832-5836.
Yin, Zongyou, et al., "Single-Layer $MoS_2$ Phototransistors," ACS NANO, vol. 6, No. 1, 2012, pp. 74-80.
Lee, Hee Sung, et al., "$MoS_2$ nanosheet Phototransistors with Thickness-Modulated Optical Energy Gap," American Chemical Society, nano Letters, vol. 12, 2012, pp. 3695-3700.
Lopez-Sanchez, oriol, et al., " Ultrasensitive photodetectors based on monolayer $MoS_2$," Nature Nanotechnology, vol. 8, Jul. 2013, pp. 497-501.
Yu, Seong Hun, et al. "Dye-Sensitized $MoS_2$ Photodetector with Enhanced Spectral Photoresponse," ACS NANO, vol. 8, No. 8, 2014, pp. 8285-8291.
Tsai, Dung-Sheng, et al., "Few-Layer $MoS_2$ with High Broadband Photogain and Fast Optical Switching for Use in Harsh Environments," ACS NANO, vol. 7, No. 5, 2013, pp. 3905-3911.
Zhang, Wenjing, et al, "High-Gain Phototransistors Based on a CVD $MoS_2$ Monolayer," Advanced Materials, vol. 25, 2013, pp. 3456-3461.
Lu, Junpeng, et al., "Improved Photoelectrical Properties of $MoS_2$ Films after Laser Micromachining," ACS NANO, vol. 8, No. 6, 2014, pp. 6334-6343.
Luo, Siwei, et al. "Photoresponse properties of large-area MoS2 atomic layer synthesized by vapor phase deposition," Journal of Applied Physics, vol. 116, 2014, pp. 164304-1-164304-6.
Mak, Kin Fai, et al., "Atomically Thin $MoS_2$: A New Direct-Gap Semiconductor," The American Physical Society, vol. 105, 2010, pp. 136805-1-136805-4.
Liu, Keng-Ku, et al., "Growth of Large-Area and Highly Crystalline $MoS_2$ Thin Layers on Insulating Substrates," American Chemical Society, Nano Letters, vol. 12, 2012, pp. 1538-1544.
Najmaei, Sina, et al., "Vapour phase growth and grain boundary structure of molybdenum disulphide atomic layers," Nature Materials, vol. 12, Aug. 2013, pp. 754-759.
Zhan, Yongjie, et al., "Large-Area Vapor-Phase Growth and Characterization of $MoS_2$ Atomic Layers on a $SiO_2$ Substrate," Small Journal, vol. 8, No. 7, 2012, pp. 966-971.
Yu, Yifei, et al., "Controlled Scalable Synthesis of Uniform, High-Quality Monolayer and Few-layer $MoS_2$ Films," Scientific Reports, 2013, pp. 1-6.
Yang, Jaehyun, et al., "Wafer-scale synthesis of thickness-controllable $MoS_2$ films via solution-processing using a dimethylformamide/n-butylamine/2-aminoethanol solvent system," Royal Society of Chemistry, Nanoscale, vol. 7, 2015, pp. 9311-9319.
George, Aaron S., et al., "Wafer Scale Synthesis and High Resolution Structural Characterization of Atomically Thin $MoS_2$ Layers," Advanced Functional Materials, vol. 24, 2014, pp. 7461-7466.
Lee, Changgu, et al., "Anomalous Lattice Vibrations of Single-and Few-Layer $MoS_2$," ACS NANO, vol. 4, No. 5, 2010, pp. 2695-2700.
Kamiya, Toshio, et al., "Electronic structure of oxygen deficient amorphous oxide semiconductor a $InGaZnO_{4-x}$: Optical analyses and first-principle calculations," Physica Status Solidi, vol. 5, No. 9, 2008, pp. 3098-3100.
Fang, Hui, et al., "Strong interlayer coupling in van der Waals heterostructures built from single-layer chalcogenides," PNAS, vol. 111, No. 17, Apr. 29, 2014, pp. 6198-6202.
Lee, Youngbin, et al., "High-Performance Perovskite-Graphene Hybrid Photodetector," Advanced Matherials, vol. 27, 2015, pp. 41-46.
Park, Jin-Seong, et al., "Electronic transport properties of amorphous indium-gallium-zinc oxide semiconductor upon exposure to water," American Institute of Physics, vol. 92, 2008, pp. 072104-1-072104-4.
Zhang, Wenjing, et al., "Ultrahigh-Gain Photodetectors Based on Atomically Thin Graphene-$MoS_2$ Heterostructures," Scientific Reports, 2013, pp. 1-8.
Xu, Hua, et al., "High Responsivity and Gate Tunable Graphene-$MoS_2$ Hybrid Phototransistor," Small Journal, vol. 10, No. 11, 2014, pp. 2300-2306.
Konstantatos, Gerasimos, et. al., "Nanostructured materials for photon detection," Nature nanotechnology, vol. 5, Jun. 2010, pp. 391-400.
Khan, M.F., et al., "Photocurrent Response of $MoS_2$ Field-Effect Transistor by Deep Ultraviolet Light in Atmospheric and $N_2$ Gas Environments," American Chemical Society, vol. 6, 2014, pp. 21645-21651.
Moazzami, K., et al., "Sub-bandgap photoconductivity in ZnO epilayers and extraction of trap density spectra," Semiconductor Science and Technology, vol. 21, 2006, pp. 717-723.
Hirano-Iwata, Ayumi, et al., "Self-formation of bilayer lipid membranes on agarose-coated silicon surfaces studied by simultaneous electrophysiological and surface infrared spectroscopic measurements," Applied Physics Letters, vol. 94, 2009, pp. 243906-1-243906-4.
Reemts, Jens, et al., "Persistent photoconductivity in highly porous ZnO films," Journal of Applied Physics, vol. 101, 2007, pp. 013709-1-013709-6.
Luo, Jiajun, et al., "Transient photoresponse in amorphous In—Ga—Zn—O thin films under stretched exponential analysis," Journal of Applied Physics, vol. 113, 2013, pp. 153709-1 153709-9.

(56) References Cited

OTHER PUBLICATIONS

Konstantatos, Gerasimos, et al., "Hybrid graphene-quantum dot phototransistors with ultrahigh gain," Nature Nanotechnology, vol. 7, Jun. 2012, pp. 363-368.

* cited by examiner

OPTOELECTRONIC DEVICE

CROSS-REFERENCE TO RELATED APPLICATION

This application claims the benefit of priority from Korean Patent Application No. 10-2015-0086179, filed on Jun. 17, 2015, in the Korean Intellectual Property Office, the disclosure of which is incorporated herein in its entirety by reference.

BACKGROUND

1. Field

Example embodiments relate to an optoelectronic device having photoresponsivity.

2. Description of the Related Art

Optoelectronic devices convert an optical signal into an electrical signal, and typically include photodetectors such as photodiodes, phototransistors, and the like. A general photodetector is generally formed so as to include a multi-layer-structured semiconductor thin film having a doping region formed in a silicon substrate by, for example, an ion injecting method or the like. An image sensor may also include optoelectronic devices arranged in a two-dimensional (2D) array and may be used in various fields related to, for example, cameras, motion recognition cameras, touch panels and the like.

In order to be applied to these various fields, an optoelectronic device is supposed to be able to detect light in a wide spectral range, to improve a degree of integration, and to be manufactured with a large surface area. In order to improve the degree of integration of the optoelectronic device, a decrease in the size of a unit optoelectronic device is required, and since an area of a light-receiving unit decreases as the size decreases, photoresponsivity is crucial.

SUMMARY

Example embodiments relate to an optoelectronic device having wide spectral responsivity and high photoresponsivity.

Additional example embodiments will be set forth in part in the description which follows and, in part, will be apparent from the description, or may be learned by practice of the presented example embodiments.

According to an example embodiment, an optoelectronic device includes an oxide semiconductor layer, a semiconducting two-dimensional (2D) material layer forming a stack structure with the oxide semiconductor layer, and an electrode electrically connected to the oxide semiconductor layer or the semiconducting 2D material layer.

The oxide semiconductor layer and the semiconducting 2D material layer may form a heterostructure.

The semiconducting 2D material layer may include a transition-metal dichalcogenide material.

The semiconducting 2D material layer may include any one of molybdenum sulfide ($MoS_2$), molybdenum selenide ($MoSe_2$), tungsten sulfide ($WS_2$), and tungsten selenide ($WSe_2$).

The semiconducting 2D material layer may have a band gap of about 1.2 eV to about 1.8 eV.

The oxide semiconductor layer may include any one of amorphous indium gallium zinc oxide (a-IGZO) and zinc oxide (ZnO).

The oxide semiconductor layer may have a band gap of about 3.0 eV or more.

The semiconducting 2D material layer may absorb light in a visible light region, and the oxide semiconductor layer may absorb light in an ultraviolet (UV) region.

The semiconducting 2D material layer may be formed on the oxide semiconductor layer, and the electrode may include a plurality of upper electrodes formed in a plurality of regions on the semiconducting 2D material layer so as to be spaced apart from each other.

A phototransistor may be formed by further including, below the oxide semiconductor layer, a lower electrode and an insulating layer covering the lower electrode.

The semiconducting 2D material layer may be formed on the oxide semiconductor layer, and the electrode may include a plurality of upper electrodes via the semiconducting 2D material layer formed in a plurality of regions, wherein the upper electrodes are spaced apart from each other and are in contact, for example in direct contact, with the oxide semiconductor layer.

A phototransistor may be formed by further including, below the oxide semiconductor layer, a lower electrode and an insulating layer substantially covering the lower electrode.

The electrode may be provided to at least one of, or to each of, the upper and lower sides of the stack structure formed of or including the oxide semiconductor layer and the semiconducting 2D material layer to form any one of a phototransistor, a photodetector and an image sensor including a 2D array of optoelectronic devices.

The oxide semiconductor layer may be used as a channel layer through which carriers generated when light is absorbed by the semiconducting 2D material layer move.

BRIEF DESCRIPTION OF THE DRAWINGS

These and/or other example embodiments will become apparent and more readily appreciated from the following description of the example embodiments, taken in conjunction with the accompanying drawings in which.

DETAILED DESCRIPTION

Reference will now be made in detail to example embodiments illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures.

Hereinafter, an optoelectronic device according to one or more example embodiments will be described in detail with reference to the accompanying drawings. In the drawings, the thicknesses or sizes of layers or regions may be exaggerated for clarity. When it is described through the specification that one layer is located "above," or on an upper part of," it may be understood that the one layer may be located "on" a substrate or another layer directly or via another layer in the middle.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

The optoelectronic device according to one or more example embodiments may form any one of a phototransistor, a photodetector, and an image sensor including a two-dimensional (2D) array of optoelectronic devices by having a stack structure of an oxide semiconductor layer and a semiconducting 2D material layer, and by respectively providing electrodes to upper and lower sides of the stack structure of the oxide semiconductor layer and the semiconducting 2D material layer. In addition, this method may be applied to various devices requiring wide spectral responsivity and high photoresponsivity.

Figure 1:
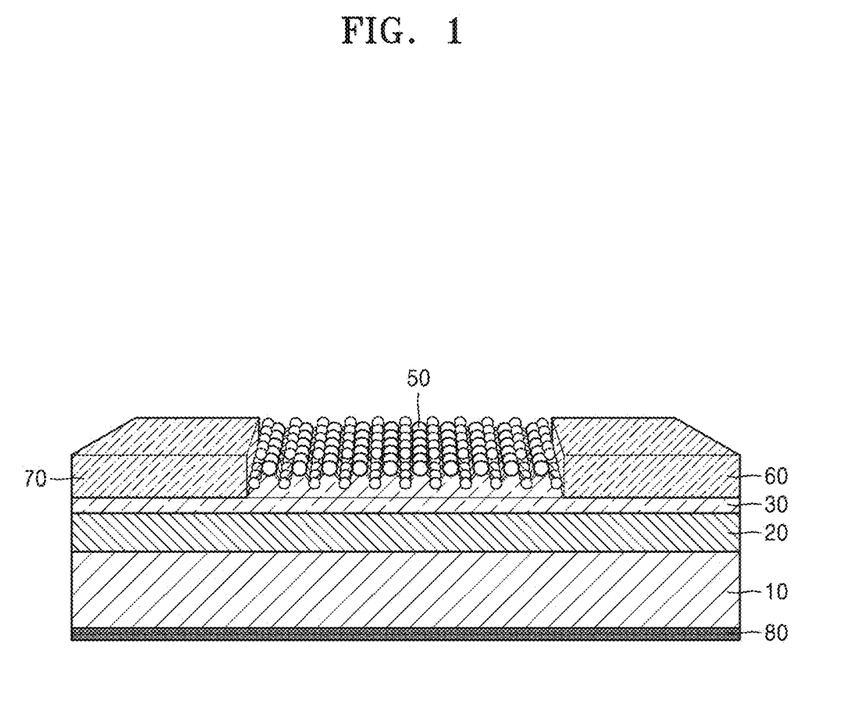
FIG. 1 illustrates a schematic view of an optoelectronic device, according to at least one example embodiment.

FIG. 1 illustrates a schematic view of an optoelectronic device, according to an example embodiment.

Referring to FIG. 1, the optoelectronic device may include an oxide semiconductor layer 30, a semiconducting 2D material layer 50 forming a stack structure with the oxide semiconductor layer 30, and an electrode (50 or 60) electrically connected to the oxide semiconductor layer 30 or the semiconducting 2D material layer 50. The stack structure of the oxide semiconductor layer 30 and the semiconducting 2D material layer 50 may be formed on a substrate 10. That is, the oxide semiconductor layer 30 may be formed on the substrate 10, and the semiconducting 2D material layer 50 may be formed on the oxide semiconductor layer 30. In this case, the oxide semiconductor layer 30 and the semiconducting 2D material layer 50 may be stacked in a heterostructure configuration. The example embodiments below including the example embodiment of FIG. 1 illustrate a case where the oxide semiconductor layer 30 is formed on the substrate 10, and the semiconducting 2D material layer 50 is formed on the oxide semiconductor layer 30, but the stacking order may be reversed. For example, the semiconducting 2D material layer 50 may be formed on the substrate 10, and the oxide semiconductor layer 30 may be formed on the semiconducting 2D material layer 50.

In various example embodiments, the substrate 10 may be or include a substrate used to manufacture general semiconductor devices. For example, the substrate 10 may be any one of a silicon substrate, a glass substrate, a plastic substrate, and an insulating polymer substrate. For example, the substrate 10 may be or include a substrate used to manufacture an optoelectronic device or a device including an array of such optoelectronic devices, e.g., an image sensor or the like. When a silicon substrate or the like is used as the substrate 10, an insulating layer 20 may be further formed. FIG. 1 illustrates a silicon substrate or the like being the substrate 10, and the insulating layer 20 being formed on the substrate 10.

The insulating layer 20 may be formed of or include a material having a low electrical conductivity, e.g., a material used as an interlayer dielectric (ILD) layer of a general electronic device. For example, the insulating layer 20 may include silicon oxide ($SiO_2$) or a high-k material having a higher dielectric constant than the dielectric constant of $SiO_2$ and may be formed of or include silicon nitride, hafnium oxide, aluminum oxide, tungsten oxide, tantalum oxide, titanium oxide, ruthenium oxide, or the like. Alternatively, the insulating layer 20 may be formed of or include an insulating polymer.

The oxide semiconductor layer 30 may generate a photocurrent by absorbing light and may have a high carrier mobility. The oxide semiconductor layer 30 may be formed of or include a material including, for example, a zinc (Zn) oxide semiconductor, an indium (In) oxide semiconductor, or a gallium (Ga) oxide semiconductor. For example, the oxide semiconductor layer 30 may include In—Ga—Zn oxide (IGZO) or ZnO. An example embodiment where the oxide semiconductor layer 30 is formed of or include IGZO will be described as an example.

The oxide semiconductor layer 30 may be formed to have a band gap of about 3.0 eV or more. In this case, the oxide semiconductor layer 30 may generate a photocurrent by absorbing light in an ultraviolet (UV) region. In addition, since the oxide semiconductor layer 30 has a high carrier mobility, the oxide semiconductor layer 30 may operate as a channel layer for carriers generated by the semiconducting 2D material layer 50 as a result of absorption of light.

The oxide semiconductor layer 30 may be formed at a thickness of, for example, several nm (nanometers) to tens of nm. For example, the oxide semiconductor layer 30 may be formed of or include an amorphous IGZO (a-IGZO) material with the thickness of about 10 nm. The a-IGZO has a band gap of about 3.0 eV or more. Hereinafter, IGZO may indicate a-IGZO. The thickness of the oxide semiconductor layer 30 is not limited to a thickness range of several nm to tens of nm, and may vary within a range satisfying a light-absorbing requirement of a desired wavelength band and the high carrier mobility.

The semiconducting 2D material layer 50 may include, for example, a transition-metal dichalcogenide (TMDC) material. The TMDC material is a compound including a transition metal and two chalcogens, and has a layered structure exhibiting a strong in-plane interatomic covalent bond and connected by a weak interlayer Van der Waals force. The TMDC material typically exhibits a semiconductor characteristic having a band gap.

The semiconducting 2D material layer 50 may include any one of chromium (Cr), molybdenum (Mo), and tungsten (W). The semiconducting 2D material layer 50 may include any one of other types of transition metals, e.g., niobium (Nb), vanadium (V), tantalum (Ta), titanium (Ti), zirconium (Zr), hafnium (Hf), technetium (Tc), and rhenium (Re). The semiconducting 2D material layer 50 may include any one chalcogen material of sulfur (S), selenium (Se), and tellurium (Te).

For example, the semiconducting 2D material layer 50 may include any one TMDC material of $MoS_2$, $MoSe_2$, $WS_2$, and $WSe_2$. Alternatively, the semiconducting 2D material layer 50 may include a TMDC material obtained from various combinations of a transition metal and a chalcogen material.

The semiconducting 2D material layer 50 may be provided to absorb light in a visible light region. That is, the semiconducting 2D material layer 50 may be formed to have a band gap of about 1.2 eV to about 1.8 eV. In this case, the semiconducting 2D material layer 50 may generate a photocurrent by absorbing the light in the visible light region. The photocurrent generated by the semiconducting 2D material layer 50 may be transferred through the oxide semiconductor layer 30 having a relatively high carrier mobility. That is, the oxide semiconductor layer 30 may also function as a channel layer for the semiconducting 2D material layer 50.

Figure 2:
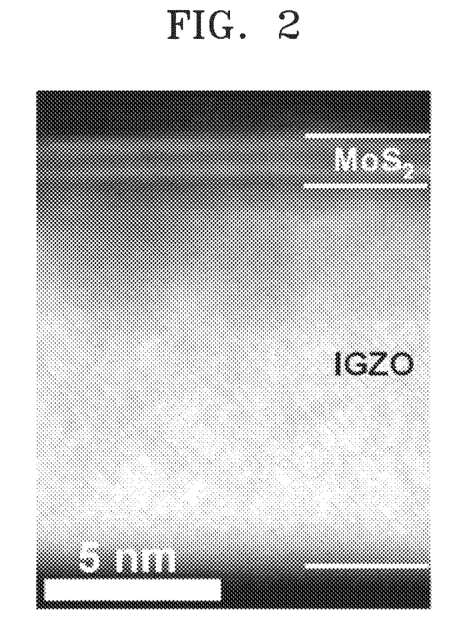
FIGS. 2 and 3 illustrate an STEM-HAADF image and an HRTEM image of a heterostructured molybdenum sulfide ($MoS_2$)/indium gallium zinc oxide (IGZO) stack, respectively.
Figure 3:
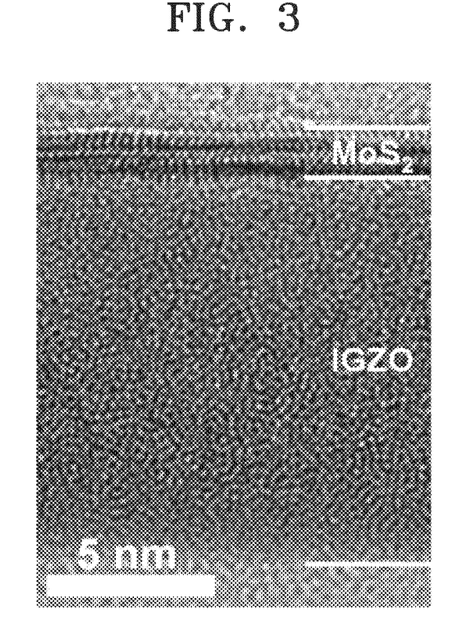

The semiconducting 2D material layer 50 may be of a single-layered TMDC material or a multi-layered TMDC material. FIG. 1 shows a case where the semiconducting 2D material layer 50 is formed as a single layer. The semiconducting 2D material layer 50 may be formed as about two layers, as shown in FIGS. 2 and 3. Alternatively, the semiconducting 2D material layer 50 may be formed as two or more layers.

FIGS. 2 and 3 show images of a structure in which the semiconducting 2D material layer 50 is stacked on the oxide semiconductor layer 30, and respectively illustrate an STEM-HAADF (Scanning Transmission Electron Microscopy—High Angle Annular Dark Field) image and an HRTEM (High Resolution Transmission Electron Microscopy) image of a heterostructured MoS$_2$/IGZO stack when the oxide semiconductor layer 30 is formed of or include IGZO and MoS$_2$ as the semiconducting 2D material layer 50 is stacked on the IGZO. FIG. 2 shows an image of the heterostructured MoS$_2$/IGZO stack through an HAADF TEM analysis in an STEM mode.

According to the heterostructured MoS$_2$/IGZO stack in FIGS. 2 and 3, an IGZO layer has a thickness of about 10 nm, and an MoS$_2$ layer is roughly bilayered.

As shown in FIGS. 2 and 3, the semiconducting 2D material layer 50 forms a layered structure and may be formed as one or more layers in the layered structure.

Referring back to FIG. 1, the optoelectronic device may include a pair of upper electrodes 60 and 70 spaced apart from each other on the oxide semiconductor layer 30. In addition, the optoelectronic device may further include a lower electrode 80 below the oxide semiconductor layer 30. When the pair of upper electrodes 60 and 70 on the oxide semiconductor layer 30 and the lower electrode 80 below the oxide semiconductor layer 30 are included, the optoelectronic device according to an example embodiment may operate as a phototransistor. In this case, the pair of upper electrodes 60 and 70 may correspond to a source electrode and a drain electrode, respectively, and the lower electrode 80 may correspond to a gate electrode. FIG. 1 illustrates an example embodiment where the lower electrode 80 is located below the substrate 10. In this case, the substrate 10 or the insulating layer 20 on the substrate 10 may function as a gate insulating layer. Alternatively, the lower electrode 80 may be located between the substrate 10 and the oxide semiconductor layer 30.

The pair of upper electrodes 60 and 70 may be formed using, or include, a conductive material, e.g., a metal as a general electrode material, a conductive oxide, or the like. For example, the pair of upper electrodes 60 and 70 may be formed using, or including, a metal such as Ti, platinum (Pt), ruthenium (Ru), gold (Au), silver (Ag), Mo, aluminum (Al), W, nickel (Ni), Ta, or copper (Cu), an alloy thereof, a conductive oxide such as IZO (InZnO) or AZO (AlZnO), or the like. The pair of upper electrodes 60 and 70 may be a single layer or multiple layers.

The lower electrode 80 may be formed using, or including, a conductive material, e.g., a metal as a general electrode material, a conductive oxide, or the like. For example, the lower electrode 80 may be formed using, or including, a metal, such as Ti, Pt, Ru, Au, Ag, Mo, Al, W, Ni, Ta, or Cu, or a conductive oxide such as IZO (InZnO) or AZO (AlZnO).

Figure 4:
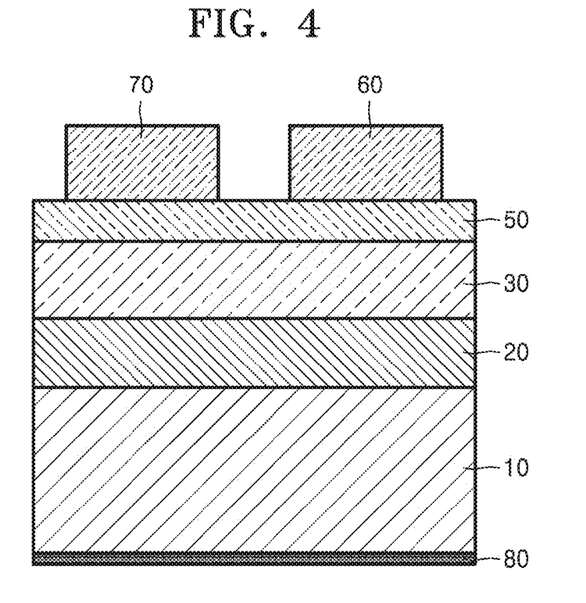
FIGS. 4 to 6 illustrate cross-sectional views of optoelectronic devices according to example embodiments.
Figure 5:
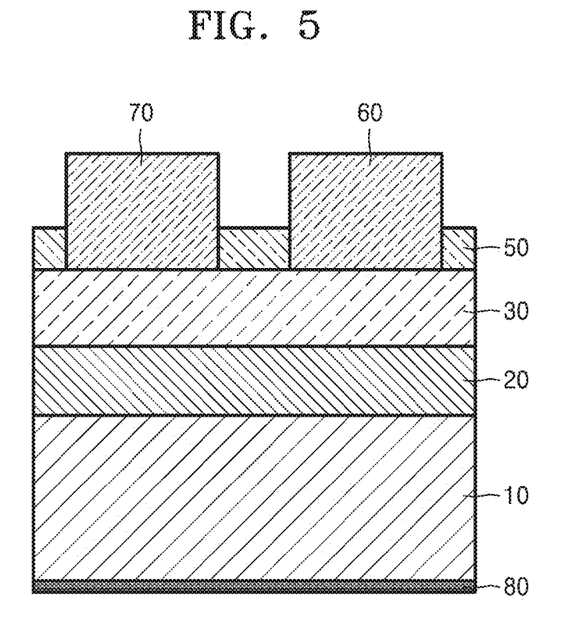

FIGS. 4 and 5 illustrate cross-sectional views of optoelectronic devices according to example embodiments.

Referring to FIGS. 4 and 5, when the optoelectronic device has a heterostructure in which the semiconducting 2D material layer 50 is located on the oxide semiconductor layer 30, the upper electrodes 60 and 70 may be formed to be electrically connected to the oxide semiconductor layer 30 indirectly through the semiconducting 2D material layer 50 (FIG. 4), or may be formed to be in direct contact with the oxide semiconductor layer 30 (FIG. 5).

FIG. 4 shows an example in which the upper electrodes 60 and 70 are formed to be spaced apart from each other in a plurality of regions on the semiconducting 2D material layer 50, and to be electrically connected to the oxide semiconductor layer 30 indirectly through the semiconducting 2D material layer 50. FIG. 5 shows an example in which the upper electrodes 60 and 70 are formed to be spaced apart from each other in a plurality of regions and to be in direct contact with the oxide semiconductor layer 30 via the semiconducting 2D material layer 50.

Although FIGS. 1, 4 and 5 illustrate embodiments where the lower electrode 80 is located at the lower surface of the substrate 10, the lower electrode 80 may be located, for example, between the substrate 10 and the oxide semiconductor layer 30.

Figure 6:
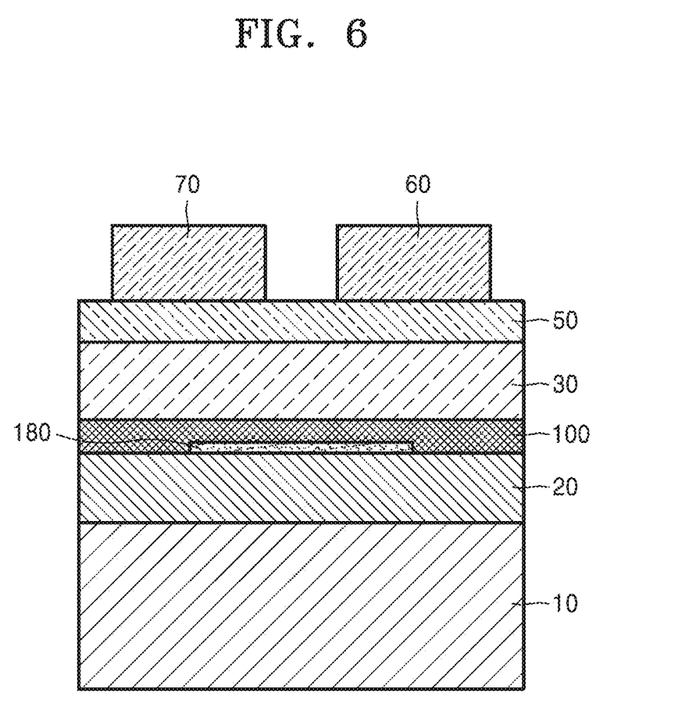

FIG. 6 illustrates a cross-sectional view of an optoelectronic device according to another example embodiment. FIG. 6 differs from FIG. 4 in that a lower electrode 180 is located between the substrate 10 and the oxide semiconductor layer 30. This structure in which the lower electrode 180 is located between the substrate 10 and the oxide semiconductor layer 30 may also be applied to a case where the upper electrodes 60 and 70 are formed to be in direct contact with the oxide semiconductor layer 30 as shown in FIG. 5, and this example can be sufficiently inferred from FIGS. 5 and 6, and thus the drawing thereof is omitted.

As shown in FIG. 6, when the lower electrode 180 is located between the substrate 10 and the oxide semiconductor layer 30, an insulating layer 100 may be further formed between the lower electrode 180 and the oxide semiconductor layer 30. In this case, the insulating layer 100 may be formed to cover the lower electrode 180. The insulating layer 100 may function as a gate insulating layer.

The insulating layer 100 may be formed using, or include, an insulating material used for a general semiconductor device. For example, the insulating layer 100 may be formed using, or include, silicon oxide (SiO$_2$) or a high-K material having a higher dielectric constant than SiO$_2$, such as hafnium oxide (HfO$_2$), aluminum oxide (Al$_2$O$_3$), silicon nitride (Si$_3$N$_4$), or the like. The insulating layer 100 may have a single-layer or a multi-layer structure.

When the substrate 10 is an insulating substrate, the lower electrode 180 may be formed between the substrate 10 and the insulating layer 100 such that the insulating layer 100 functions as a gate insulating layer. In this case, the insulating layer 20 may be omitted.

According to the optoelectronic device of one or more of the example embodiments described above, the semiconducting 2D material layer 50 may be used as, or include, a visible light absorbing layer, and the oxide semiconductor layer 30 may function as, or include, a UV absorbing layer and simultaneously or contemporaneously as a channel layer of a high-performance transistor by forming the stack structure of the semiconducting 2D material layer 50 and the oxide semiconductor layer 30 to be an MoS$_2$/a-IGZO stack structure. Accordingly, the semiconducting 2D material layer 50 includes MoS$_2$ and the oxide semiconductor layer 30 includes IGZO. That is, carriers generated due to light absorption in the semiconducting 2D material layer 50 may move through the oxide semiconductor layer 30.

In this case, since a desired degree of visible light absorption is obtained even when the semiconducting 2D material layer 50 is formed with, or include, a few-layered MoS$_2$ of one or two layers, the semiconducting 2D material layer 50 may be synthesized by a solution process based on spin coating. Therefore, a stack structure of the semiconducting 2D material layer 50 and the oxide semiconductor layer 30 formed with a heterostructured MoS$_2$/a-IGZO stack may be obtained by transferring a few-layered MoS$_2$ thin film obtained by, for example, a solution process based on spin coating onto an IGZO thin film formed by, for example, sputtering deposition or the like.

As described above, when the semiconducting 2D material layer 50 is formed of or include a few layers of a layered material, the semiconducting 2D material layer 50 may be manufactured to have a large area by spin coating. That is, the optoelectronic device according to the example embodiments described above may be manufactured to have a large area.

In addition, the optoelectronic device according to one or more of the example embodiments described above may generate a photocurrent by absorbing light in a visible light region and a UV region, and thus the optoelectronic device may detect light in a wide spectral range. In addition, since the oxide semiconductor layer 30 is usable as a channel layer for the semiconducting 2D material layer 50, the optoelectronic device has a good photoresponsivity, and thus the area of a light-receiving portion may be miniaturized. Accordingly, a degree of integration of optoelectronic devices may increase.

The optoelectronic device according to one or more of the example embodiments described above may be manufactured by the process below. Herein, the thickness of each layer is only illustrative, and the layer thickness of the optoelectronic device is not limited thereto. In addition, the manufacturing process described below is only a specific example among various example methods of manufacturing the optoelectronic device according to one or more of the example embodiments described above, and the process of manufacturing the optoelectronic device according to one or more of the example embodiments described above is not limited thereto.

An IGZO thin film of an about 10-nm thickness may be deposited on a p-type silicon wafer covered by an SiO2 thin film of about 300-nm in thickness. In this case, the p-type silicon wafer may be in a highly degenerated state. In addition, the IGZO thin film may be deposited using, for example, a radio frequency (RF) magnetron sputtering method. Source and drain electrodes may be patterned by, for example, thermal-evaporating Al of an about 80-nm thickness by a photolithography lift-off process so that each of the source and drain electrodes has a channel width and a length of, for example, about 100 μm and about 50 μm, respectively. A few-layered $MoS_2$ thin film may be synthesized by a solution process and transferred onto a prepared patterned substrate. The synthesis of the few-layered $MoS_2$ thin film by a solution process may be performed by, for example, a spin-coating and pyrolyzing process. An $MoS_2$ spin-coating solution may be made to have a density of 0.006 M by dissolving $(NH_4)_2MoS_4$ by a solution (volume ratio of dimethylformamide:butylamine:aminoethanol=1:1:0.2) and may be spin-coated on an $SiO_2$/Si substrate pre-processed using oxygen plasma. This spin-coated thin film may be annealed, for example, over two stages so as to obtain a high-crystalline stoichiometric $MoS_2$ thin film. The $MoS_2$ thin film synthesized by the above-described method may be transferred onto an IGZO surface. A polymethylmethacrylate (PMMA) support layer may be used for the transfer, and the PMMA support layer may be removed after the transfer.

As described above, since an $MoS_2$/IGZO heterostructure is formed by forming the few-layered $MoS_2$ thin film by using a spin coating method and transferring the few-layered $MoS_2$ thin film onto an IGZO layer, the $MoS_2$ thin film may be manufactured to have a large area. Since the IGZO layer may be formed by a deposition method, for example, sputtering or the like, the IGZO layer may also be manufactured to have a large area. Therefore, the optoelectronic device according to one or more of the example embodiments described above may be manufactured to have a large area.

Electrical characteristic data when the stack structure of the semiconducting 2D material layer 50 and the oxide semiconductor layer 30 applied to the optoelectronic device according to one or more of the example embodiments described above is formed as a heterostructured $MoS_2$/IGZO stack will now be described.

Figure 7:
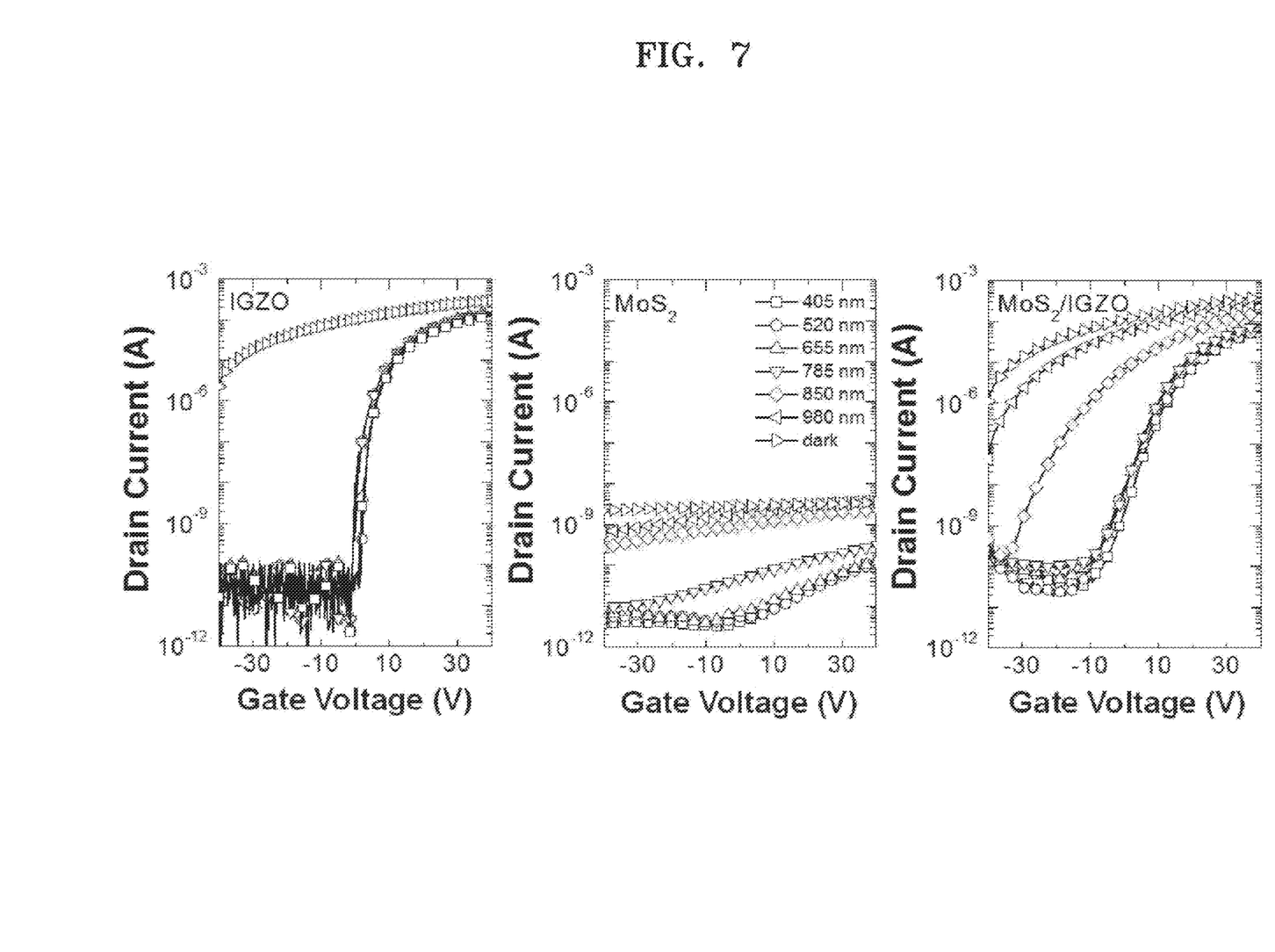
FIG. 7 illustrates transfer characteristics of IGZO, $MoS_2$, and $MoS_2$/IGZO phototransistors when light for each wavelength is irradiated at fixed power.

FIG. 7 illustrates transfer characteristics of IGZO, $MoS_2$, and $MoS_2$/IGZO phototransistors when light for each wavelength is irradiated at fixed power. FIG. 7 shows changes in a drain current according to a gate voltage for each wavelength when power of irradiated light is fixed to about 0.5 mW and light for each wavelength within a range of about 405 nm to about 980 nm is irradiated, wherein the left graph shows a case where a light-absorbing layer of a phototransistor is formed only with an IGZO layer, the center graph shows a case where the light-absorbing layer of the phototransistor is formed only with an $MoS_2$ layer, and the right graph shows a case where the light-absorbing layer of the phototransistor is formed in an $MoS_2$/IGZO heterostructure.

When the light-absorbing layer is formed only with an IGZO layer, the light-absorbing layer responds to a light of about a 405-nm wavelength or less. However, when the light-absorbing layer is formed as a heterostructured $MoS_2$/IGZO stack, the light-absorbing layer responds to a light wavelength starting from a visible light region that is about 785 nm or less. Therefore, the low photoresponsivity in a visible light region when the light-absorbing layer is formed only with an IGZO layer may be overcome through a heterostructure with the semiconducting 2D material layer 50.

In addition, as shown in FIG. 7, when the light-absorbing layer is formed in an $MoS_2$/IGZO heterostructure, a photocurrent significantly increases in a range from a visible light region to a UV region than when the light-absorbing layer is formed only of $MoS_2$.

Figure 8:
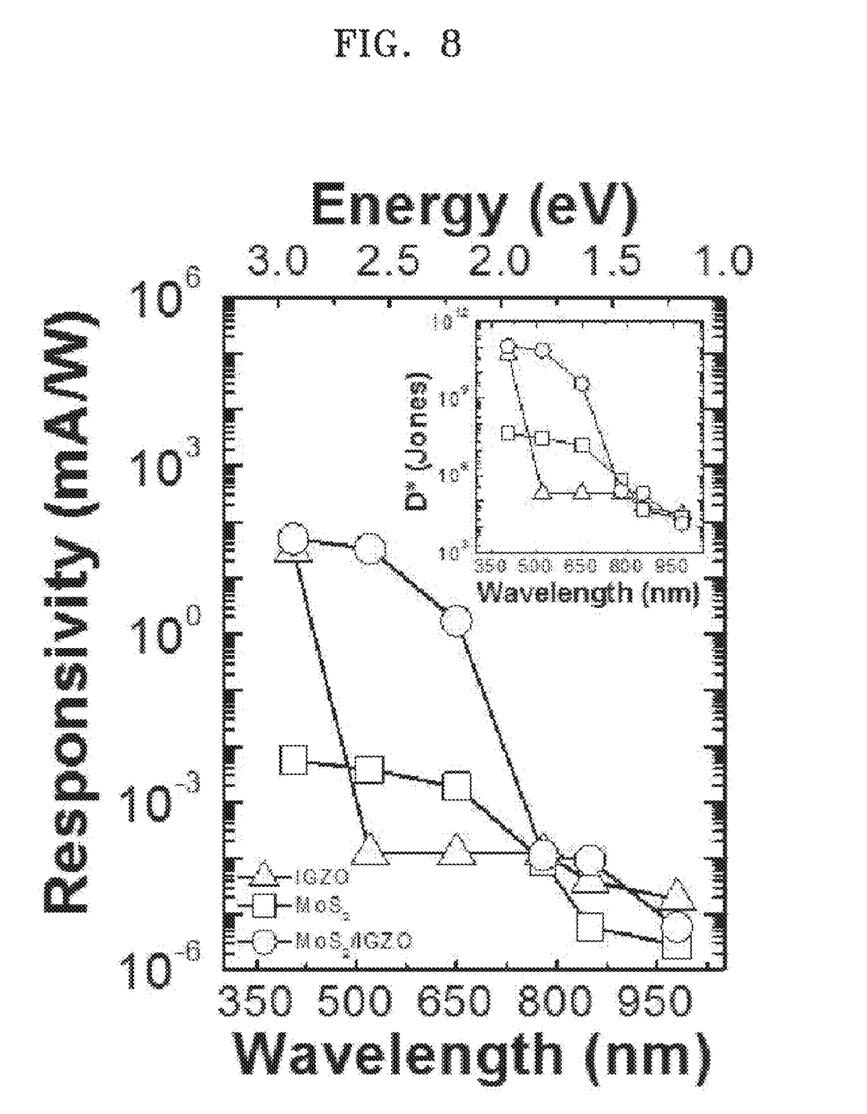
FIG. 8 illustrates photoresponsivity characteristics of the IGZO, $MoS_2$, and $MoS_2$/IGZO phototransistors according to wavelengths.

FIG. 8 illustrates photoresponsivity characteristics of the IGZO, $MoS_2$, and $MoS_2$/IGZO phototransistors according to wavelengths. The graph in FIG. 8 is obtained by setting a gate voltage VG as −10 V.

As shown in FIG. 8, when the light-absorbing layer is formed in an $MoS_2$/IGZO heterostructure, photoresponsivity significantly increases in a range from a visible light region to a UV region than when the light-absorbing layer is formed only of IGZO or $MoS_2$. In FIG. 8, the small graph in a box shows photodetectivity D*. Similarly to the photoresponsivity, the photodetectivity also significantly increases in a range from a visible light region to a UV region when the light-absorbing layer is formed in an $MoS_2$/IGZO heterostructure than when the light-absorbing layer is formed only of IGZO or MoS2.

Figure 9:
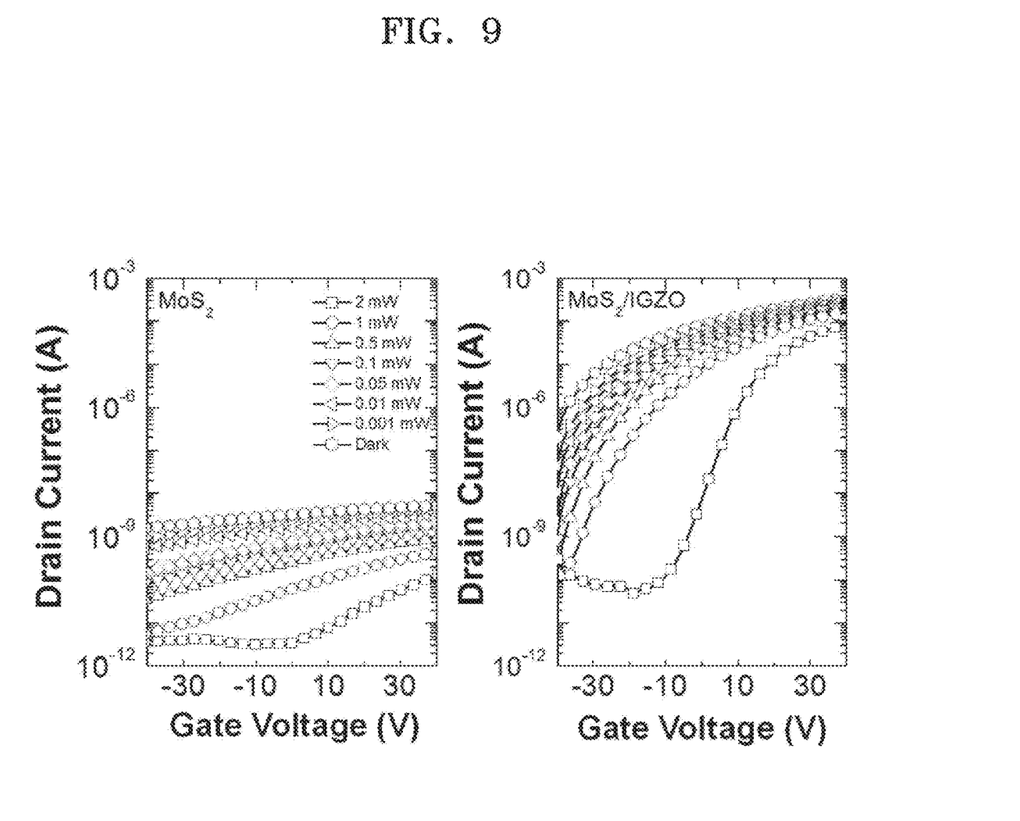
FIG. 9 illustrates photoinduced transfer characteristics of the $MoS_2$ and $MoS_2$/IGZO phototransistors for each optical power when light of a specific wavelength is irradiated while changing optical power.

FIG. 9 illustrates photoinduced transfer characteristics of the $MoS_2$ and $MoS_2$/IGZO phototransistors for each optical power when light of a specific wavelength is irradiated while changing optical power. FIG. 9 shows changes in a drain current according to a gate voltage for each optical power when power of irradiated light of which a wavelength is about 520 nm is changed to 0.001 mW, 0.01 mW, 0.05 mW, 0.1 mW, 0.5 mW, 1 mW, and 2 mW, wherein the left graph shows a case where the light-absorbing layer of the phototransistor is formed only with an $MoS_2$ layer, and the right graph shows a case where the light-absorbing layer of the phototransistor is formed in an $MoS_2$/IGZO heterostructure. Conductive characteristic significantly increases when the light-absorbing layer is formed in an MoS$_2$/IGZO heterostructure than when the light-absorbing layer is formed only of MoS$_2$.

In addition, as shown in FIG. 9, a photocurrent significantly increases at same optical power when the light-absorbing layer is formed in an MoS$_2$/IGZO heterostructure than when the light-absorbing layer is formed only of MoS$_2$. In addition, when the light-absorbing layer is formed in an MoS$_2$/IGZO heterostructure, a photocurrent also increases according to optical power.

Figure 10:
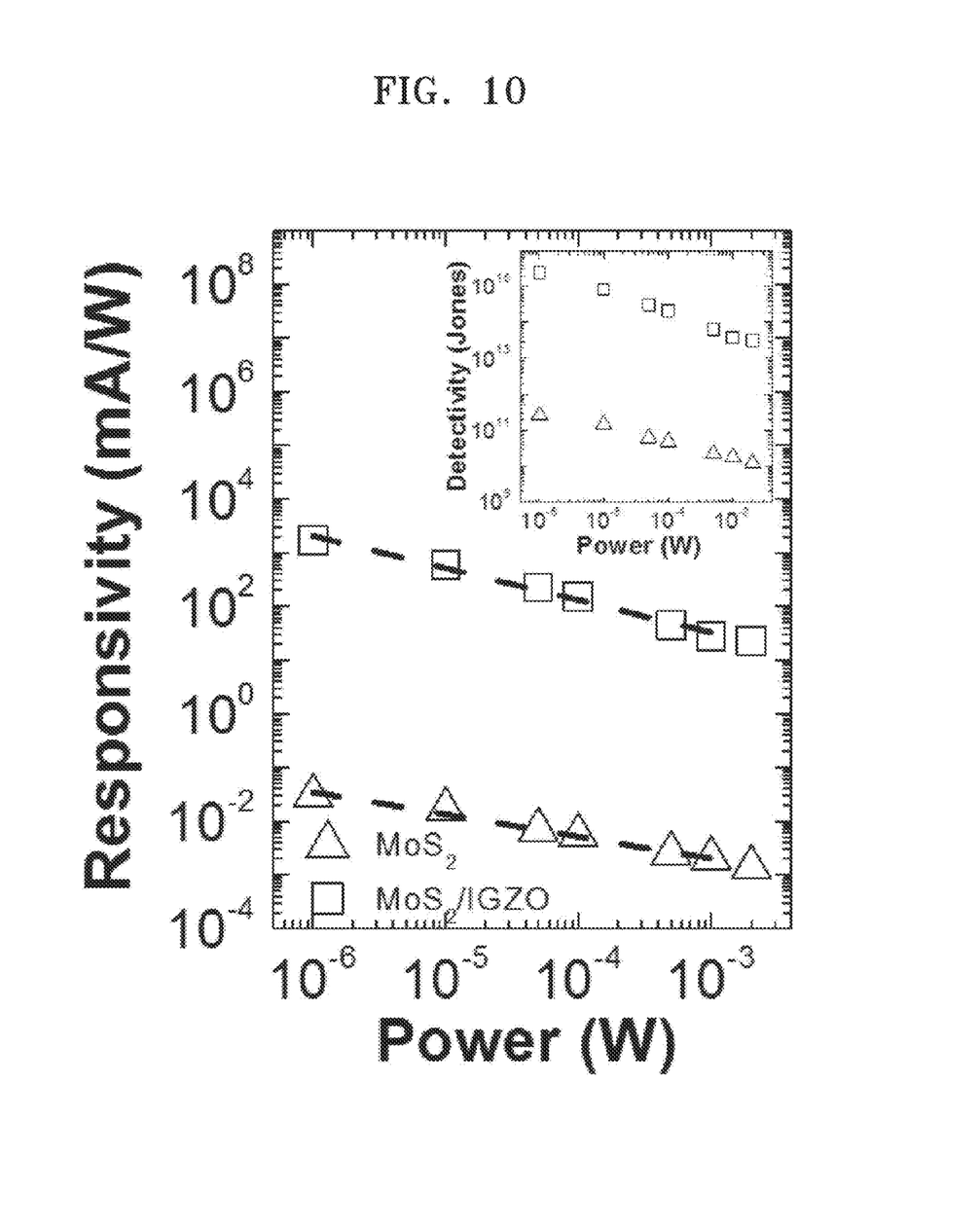
FIG. 10 illustrates changes in photoresponsivity of the $MoS_2$ and $MoS_2$/IGZO phototransistors according to optical power.

FIG. 10 illustrates changes in photoresponsivity of the MoS$_2$ and MoS$_2$/IGZO phototransistors according to optical power. The graph in FIG. 10 is obtained by setting the gate voltage VG as −10 V.

As shown in FIG. 10, when the light-absorbing layer is formed in an MoS$_2$/IGZO heterostructure, photoresponsivity tends to decrease as optical power increases as well as when the light-absorbing layer is formed only of MoS$_2$. In FIG. 10, the small graph in a box shows photodetectivity D*. Similarly to the photoresponsivity, the photodetectivity also tends to decrease as optical power increases when the light-absorbing layer is formed in an MoS$_2$/IGZO heterostructure as well as when the light-absorbing layer is formed only of MoS$_2$.

Figure 11A:
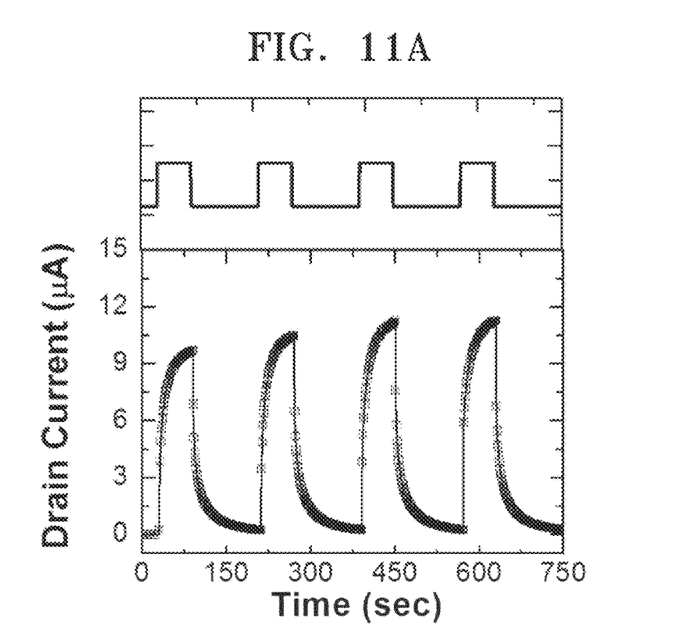
FIGS. 11A and 11B illustrate photoresponse characteristics along a time when pulsed light is irradiated on the MoS$_2$/IGZO phototransistor.
Figure 11B:
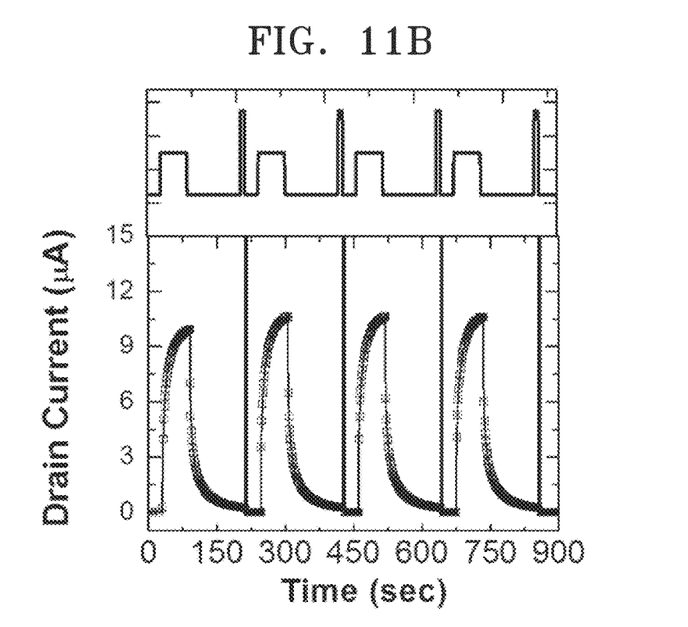

FIGS. 11A and 11B illustrate photoresponse characteristics along a time when pulsed light is irradiated on the MoS$_2$/IGZO phototransistor. The graphs in FIGS. 11A and 11B are obtained when laser pulses of which optical power is about 0.5 mW and a wavelength λ is about 520 nm are irradiated. FIGS. 11A and 11B show changes in a photocurrent along a time according to the irradiation of the laser pulses when reset voltage pulses, i.e., gate pulses, of about 40 V (VG=40 V) are applied and are not applied, respectively.

As shown in FIGS. 11A and 11B, the MoS$_2$/IGZO phototransistor has a conductive characteristic sufficiently responding to pulsed light.

A case where the optoelectronic device according to one or more of the example embodiments described above forms a phototransistor has been described and shown with examples, but this case is only illustrative, and the optoelectronic device according to one or more of the example embodiments described above is not limited to the phototransistor. The optoelectronic device according to one or more of the example embodiments described above may be implemented as a photodetector such as a photodiode, or the like, by changing an electrode structure thereof. In addition, the optoelectronic device according to one or more of the example embodiments described above may be applied to various apparatuses such as, for example, an image sensor and a touch panel having a 2D array of optoelectronic devices by patterning an electrode structure thereof.

According to one or more example embodiments, an optoelectronic device may have wide spectral responsivity and high photoresponsivity by forming a light-absorbing layer as a stack structure of an oxide semiconductor layer and a semiconducting 2D material layer.

It should be understood that example embodiments described herein should be considered in a descriptive sense only and not for purposes of limitation. Descriptions of features within each example embodiment should typically be considered as available for other similar features in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. An optoelectronic device comprising:
   an oxide semiconductor layer;
   a semiconducting two-dimensional (2D) material layer in a stacked configuration with the oxide semiconductor layer;
   an electrode electrically connected to the oxide semiconductor layer or to the semiconducting 2D material layer, the semiconducting 2D material layer being substantially entirely confined within an area defined by a surface of the oxide semiconductor layer;
   an insulating layer; and
   a substrate;
   wherein the semiconducting two-dimensional (2D) material layer, the oxide semiconductor layer and the insulating layer are sequentially interposed between the electrode and the substrate.

2. The optoelectronic device of claim 1, wherein the oxide semiconductor layer and the semiconducting 2D material layer form a hetero structure.

3. The optoelectronic device of claim 1, wherein the semiconducting 2D material layer comprises a transition-metal dichalcogenide material.

4. The optoelectronic device of claim 3, wherein the semiconducting 2D material layer comprises at least one of molybdenum sulfide (MoS$_2$), molybdenum selenide (MoSe$_2$), tungsten sulfide (WS$_2$), and tungsten selenide (WSe$_2$).

5. The optoelectronic device of claim 1, wherein the semiconducting 2D material layer has a band gap of about 1.2 eV to about 1.8 eV.

6. The optoelectronic device of claim 3, wherein the oxide semiconductor layer comprises at least one of amorphous indium gallium zinc oxide (a-IGZO) and zinc oxide (ZnO).

7. The optoelectronic device of claim 6, wherein the oxide semiconductor layer has a band gap of about 3.0 eV or more.

8. The optoelectronic device of claim 7, wherein the semiconducting 2D material layer has a band gap of about 1.2 eV to about 1.8 eV.

9. The optoelectronic device of claim 1, wherein the oxide semiconductor layer comprises at least one of amorphous indium gallium zinc, oxide (a-IGZO) and zinc oxide (ZnO).

10. The optoelectronic device of claim 9, wherein the oxide semiconductor layer has a band gap of about 3.0 eV or more.

11. The optoelectronic device of claim 10, wherein the semiconducting 2D material layer has a band gap of about 1.2 eV to about 1.8 eV.

12. The optoelectronic device of claim 1, wherein the semiconducting 2D material layer has a band gap of about 1.2 eV to about 1.8 eV, and
   the oxide semiconductor layer has a band gap of about 3.0 eV or more.

13. The optoelectronic device of claim 1, wherein the semiconducting 2D material layer is configured to absorb light in a visible light region, and
   the oxide semiconductor layer is configured to absorb light in an ultraviolet (UV) region.

14. The optoelectronic device of claim 1, wherein the semiconducting 2D material layer is on the oxide semiconductor layer, and
   the electrode comprises a plurality of upper electrodes in a plurality of regions on the semiconducting 2D material layer, the plurality of upper electrodes being spaced apart from each other.

15. The optoelectronic device of claim 1, further comprising, below the oxide semiconductor layer, a lower electrode and the insulating layer covering the lower electrode and forming a phototransistor.

16. The optoelectronic device of claim 1, wherein the semiconducting 2D material layer is on the oxide semiconductor layer, and
   the electrode comprises a plurality of upper electrodes via the semiconducting 2D material layer in a plurality of regions,
   wherein the upper electrodes are spaced apart from each other and are in direct contact with the oxide semiconductor layer.

17. The optoelectronic device of claim 16, further comprising, below the oxide semiconductor layer, a lower electrode and the insulating layer covering the lower electrode and forming a phototransistor.

18. The optoelectronic device of claim 1, wherein the electrode on upper and lower sides of the stack configuration includes the oxide semiconductor layer and the semiconducting 2D material layer and is configured to form any one of a phototransistor, a photodetector and an image sensor including a 2D array of optoelectronic devices.

19. The optoelectronic device of claim 1, wherein the oxide semiconductor layer is configured as a channel layer through which carriers generated when light is absorbed by the semiconducting 2D material layer can move.

20. The optoelectronic device of claim 19, wherein the semiconducting 2D material layer is configured to absorb light in a visible light region, and
   the oxide semiconductor layer is configured to absorb light in a UV region.

* * * * *